(12) United States Patent
Gilmer et al.

(10) Patent No.: US 6,787,421 B2
(45) Date of Patent: Sep. 7, 2004

(54) METHOD FOR FORMING A DUAL GATE OXIDE DEVICE USING A METAL OXIDE AND RESULTING DEVICE

(75) Inventors: David C. Gilmer, Austin, TX (US); Christopher C. Hobbs, Austin, TX (US); Hsing-Huang Tseng, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/219,522

(22) Filed: Aug. 15, 2002

(65) Prior Publication Data
US 2004/0032001 A1 Feb. 19, 2004

(51) Int. Cl.[7] .......................................... H01L 21/8234
(52) U.S. Cl. ...................... 438/275; 438/287; 438/981
(58) Field of Search .............................. 438/785, 981, 438/287, 766, 770, 275

(56) References Cited

U.S. PATENT DOCUMENTS

| | | | |
|---|---|---|---|
| 6,268,251 B1 | 7/2001 | Zhong et al. | |
| 6,320,238 B1 | 11/2001 | Kizilyalli et al. | |
| 6,358,819 B1 | 3/2002 | Shelton et al. | |
| 6,368,923 B1 | 4/2002 | Huang | |
| 6,432,776 B1 | 8/2002 | Ono | |
| 6,448,127 B1 * | 9/2002 | Xiang et al. | 438/216 |
| 6,503,800 B2 * | 1/2003 | Toda et al. | 438/279 |
| 2001/0031523 A1 | 10/2001 | Kimizuka | |
| 2001/0052618 A1 | 12/2001 | Hasegawa | |
| 2002/0047170 A1 | 4/2002 | Ola | |

FOREIGN PATENT DOCUMENTS

| | | |
|---|---|---|
| EP | 1 179 837 A2 | 2/2002 |
| JP | 2001284463 | 10/2001 |

OTHER PUBLICATIONS

Hobbs, Christopher C.; "DGO Formation by Lateral Oxidation;" IP.com; Jul. 15, 2002; IPCOM000008808D; <http://www.IP.com>.

* cited by examiner

Primary Examiner—Richard A. Booth
(74) Attorney, Agent, or Firm—Joanna G. Chiu; Patricia S. Goddard

(57) ABSTRACT

A semiconductor device (10) having two different gate dielectric thicknesses is formed using a single high-k dielectric layer, preferably a metal oxide. A thicker first gate dielectric (16) is formed in a region of the device for higher voltage requirements, e.g. an I/O region (24). A thinner second gate dielectric (20) is formed in a region of the device for lower voltage requirements, e.g. a core device region (22). First and second dielectrics are preferably silicon dioxide or oxynitride. A metal oxide (26) is deposited over both dielectrics, followed by deposition of a gate electrode material (28). By using a single metal oxide layer in forming the gate dielectric stack for each transistor, together with high quality silicon dioxide or oxynitride dielectric layers, problems associated with selective etching of the metal oxide may be avoided, as may problems associated with various interfaces between the metal oxide and damaged or treated surfaces.

19 Claims, 3 Drawing Sheets

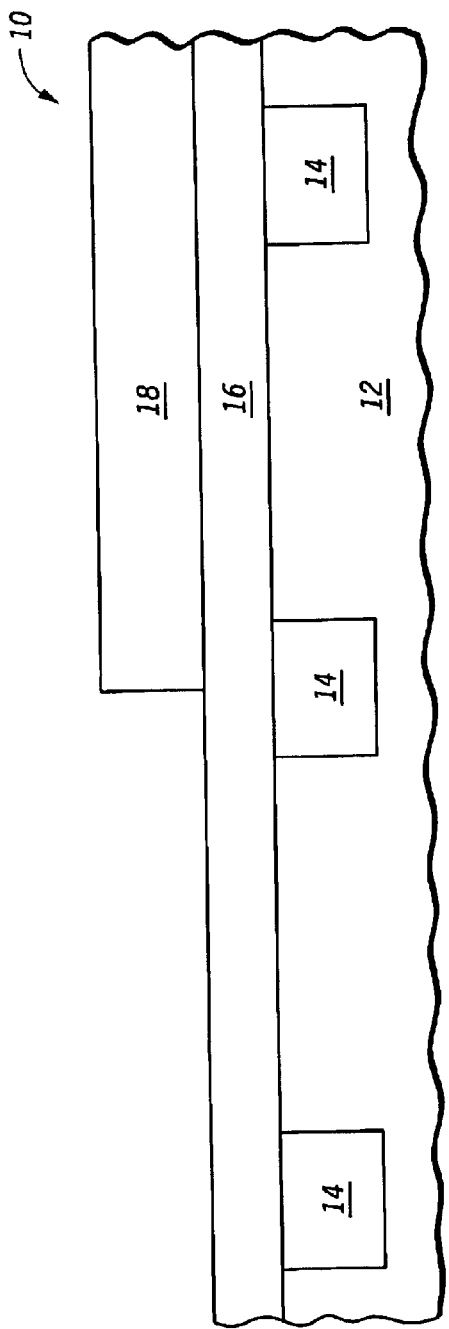
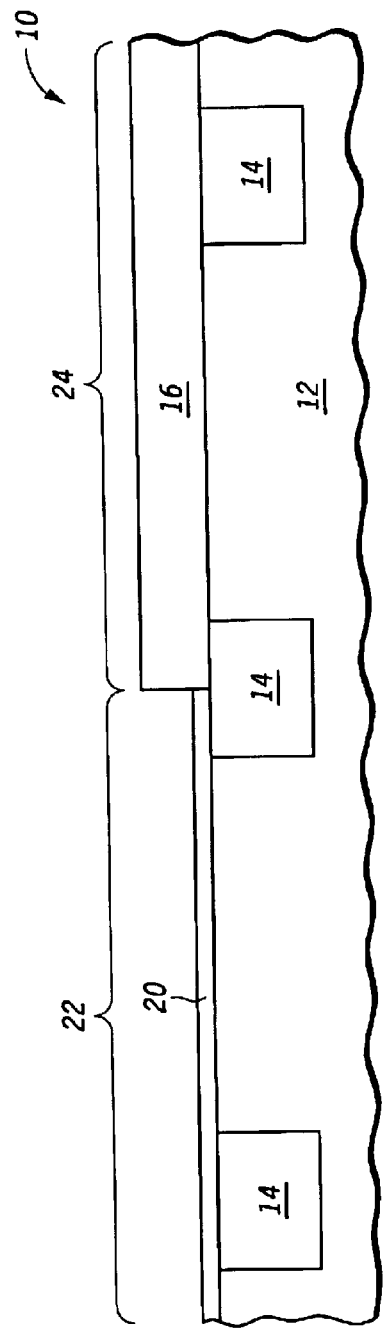

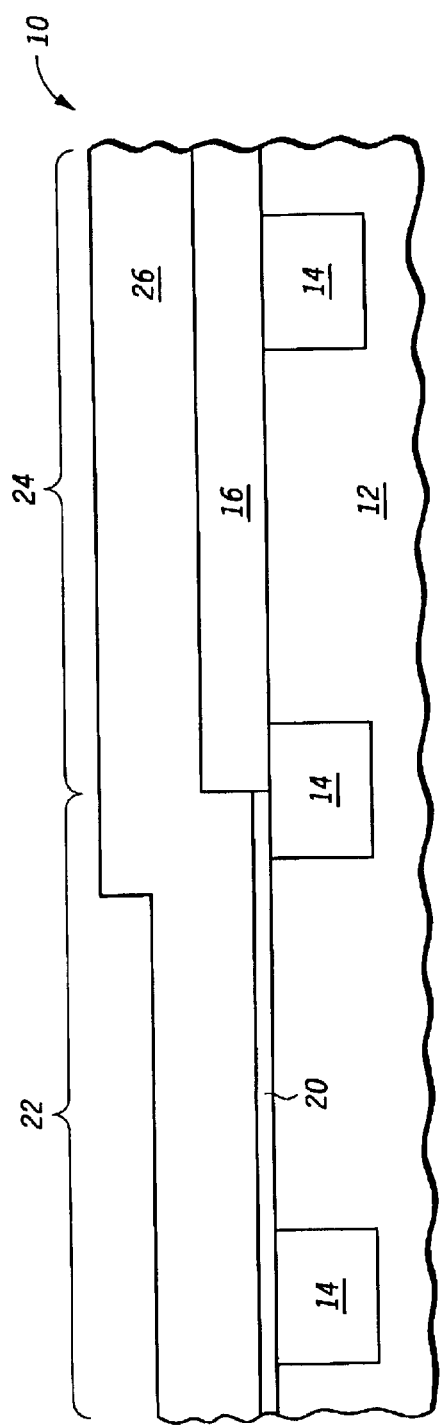
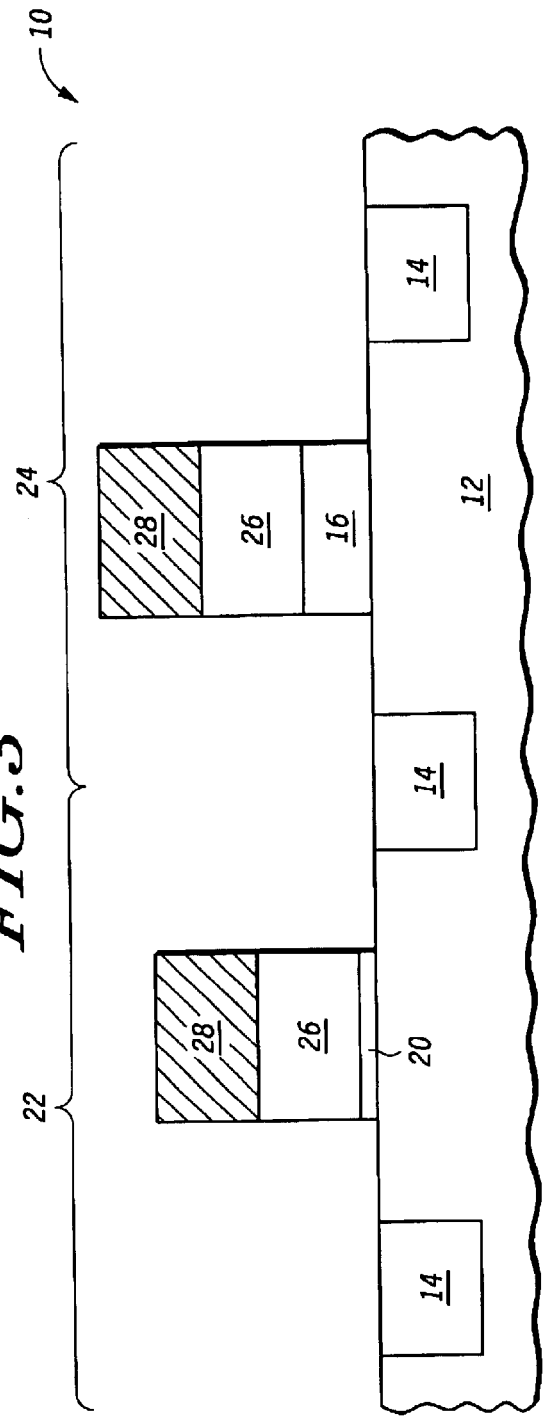

METHOD FOR FORMING A DUAL GATE OXIDE DEVICE USING A METAL OXIDE AND RESULTING DEVICE

FIELD OF THE INVENTION

The present invention relates generally to semiconductor devices, and more particularly to semiconductor devices formed having dual gate dielectric thicknesses and utilizing high-k gate dielectric materials such as metal oxides.

BACKGROUND OF THE INVENTION

In integrated circuit manufacturing, there is often a need to form transistors with different gate dielectric thicknesses on the same semiconductor substrate or wafer. For example, transistors for input/output (I/O) devices may require thicker gate dielectrics than, e.g., transistors used for the core logic. A conventional process for forming differing thickness is called a DGO process, which stands for Dual Gate Oxide. In a conventional DGO process, a "thick" silicon dioxide layer (e.g. for the I/O devices) is formed and a resist mask is used to mask the thick silicon dioxide layer in the I/O regions. The thick silicon dioxide layer is then etched away or otherwise removed from the unmasked region, where the core logic devices are to be formed. The mask is removed and a thin silicon dioxide layer is then grown over the core logic device region. The gate electrode material, typically polysilicon, is then deposited over the substrate, which at this point includes gate dielectrics of two different thicknesses. The gate electrode material and gate dielectrics are then patterned and etched to form the gate electrode and oxide stack of each transistor.

The DGO process described above has found acceptance in the industry as a manufacturable and cost effective way of producing transistors having two different gate dielectric thicknesses. However, as transistor sizes shrink there is a move in the semiconductor industry to replace traditional silicon dioxide gate dielectrics with higher-k dielectric materials (i.e. dielectrics having higher dielectric constants), such as metal oxides. But because metal oxides cannot be thermally grown on a silicon substrate as silicon dioxide can, there are problems associated with multiple metal oxide depositions to form differing oxide thicknesses and with etching of the metal oxide if one were to attempt to merely substitute a metal oxide for silicon dioxide in a conventional DGO process. Accordingly, there is a need for a semiconductor manufacturing process in which dual gate dielectric thicknesses can be achieved with metal oxides or other high-k dielectric materials.

BRIEF DESCRIPTION OF THE DRAWINGS

The present invention is illustrated by way of example and should not be limited by the accompanying figures, in which like references indicate similar elements, and in which:

FIGS. 1–4 illustrate partial cross-sectional views of a semiconductor device formed to have two gate dielectric thickness (e.g. one for core devices and one for I/O devices) as it undergoes processing in accordance with one embodiment of the present invention;

Figure 5:
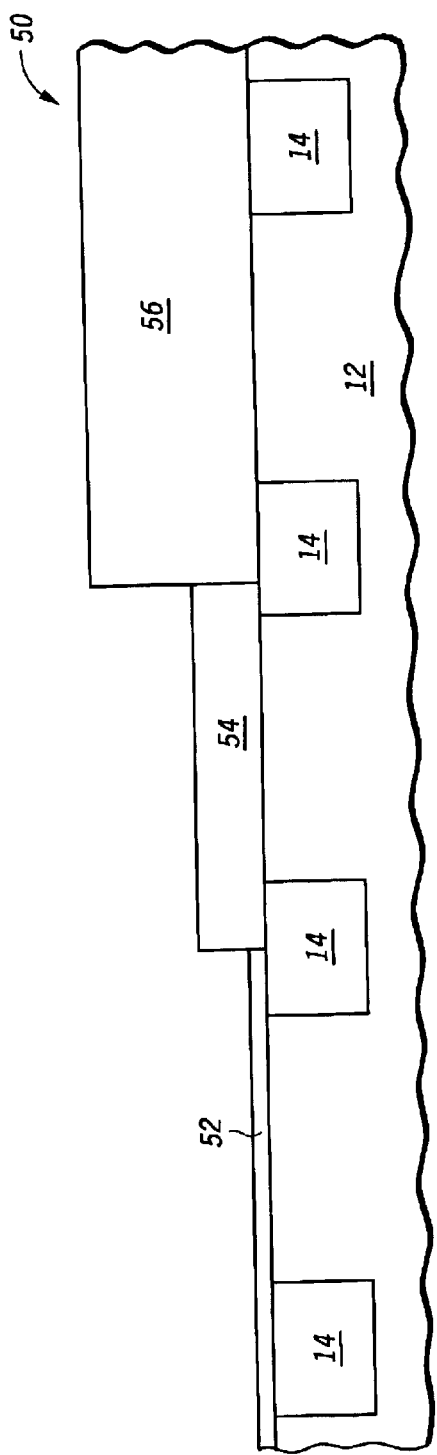
FIG. 5 is a partial cross-sectional view of a semiconductor device formed in accordance with another embodiment of the present invention in which three different gate dielectric thicknesses are formed.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The present invention integrates a high-k dielectric material, preferably a metal oxide, in a dual gate process sequence using a single metal oxide deposition to form multiple gate dielectric stacks of differing thicknesses. With the present invention, the metal oxide is formed over prepared surfaces of the substrate that already provide a difference in equivalent oxide thickness (EOT) between two different regions of the substrate (e.g. the core logic region and the I/O region). For example, a single metal oxide layer is deposited over two different thicknesses of silicon dioxide or silicon oxynitride. Thus, the metal oxide need not be etched selective to the underlying silicon substrate (which can damage the substrate surface) where a gate quality surface is required. Also with the invention, the single metal oxide layer forms an interface with a high quality silicon dioxide or silicon oxynitride layer, as opposed to an interface with a silicon surface which has been damaged or otherwise treated as a result of using conventional DGO processing methods with a metal oxide dielectric. Thus, devices formed in accordance with the invention do not suffer from degraded performance, e.g. current leakage, due to interface irregularities as a result of contamination or damaged surfaces.

Referring now to FIGS. 1–4, a semiconductor device 10 is fabricated in accordance with one embodiment of the invention. As shown in FIG. 1, semiconductor device 10 includes a semiconductor substrate 12 which in a preferred embodiment is a single crystal silicon substrate (also sometimes referred to as a wafer), but which can instead be formed from other semiconductor substrate materials. Within substrate 12, trench isolation regions 14, preferably shallow trench isolation regions, are formed in a conventional manner for the purpose of electrically isolating different individual devices to be formed. After forming trench isolation regions 14, a first gate dielectric 16 is formed over substrate 12. First gate dielectric 16 is preferably silicon dioxide or silicon oxynitride, and is preferably formed by thermal oxidiation in accordance with conventional practices. The thickness of gate dielectric 16 is determined by the particular device requirements for devices to be formed in I/O device region 24 as further explained below, but generally will be within a range of 30–50 Angstroms (3–5 nanometers).

After forming first gate dielectric 16, a (photo)resist mask 18 is formed over the substrate to mask off a portion of the first gate dielectric layer. As shown in FIG. 1, semiconductor device 10 includes two different device regions, namely a core device region 22 and an I/O device region 24. In operation, devices to be formed in core device region 22 require thinner gate dielectrics that operate at lower voltages than, e.g., I/O devices to be formed in I/O device region 24 that can withstand higher voltages required for I/O functions. Accordingly, resist mask 18 is formed to protect the portion of first gate dielectric 16 which will serve, in part, as a gate dielectric for the higher voltage I/O devices. Other dielectric materials may instead be used for first gate dielectric 16. Silicon dioxide and silicon oxynitride are attractive choices because of the industry's understanding of these materials, the ability to form high gate quality films, and because they can be formed by selective growth techniques rather than requiring blanket depositions and etch steps.

Semiconductor device 10 is then etched to remove unprotected portions of first gate dielectric 16 in core device region 22, as shown in FIG. 2. The resist mask 18 is then removed and a second gate dielectric 20 is formed on exposed portions of substrate 12 within the core device region 22. In a preferred embodiment, second gate dielectric 20 is also silicon dioxide or silicon oxynitride, but like first gate dielectric 16 other materials could be used. This second gate dielectric can be formed by thermal oxidiation and/or chemical oxidation in accordance with conventional practices. The thickness of gate dielectric 20 is also determined by the particular device requirements for devices to be formed in core device region 22 as further explained below, but generally will be within a range of 4–12 Angstroms (0.4–1.2 nanometers). Because second gate dielectric 20 is so thin, it may be difficult to adequately control the thickness or obtain an oxide of sufficient quality using thermal oxidation processes and therefore chemical oxidation may be useful. For instance, the thin dielectric may be formed by growing a thin oxide by rinsing the substrate in ozonated water. A combination of thermal and chemical treatment may also be used to form second dielectric 20. It may also be sufficient for second gate dielectric 20 to be a native oxide which is grown on substrate 12 as a result of exposing the substrate to ambient or other oxygen containing environment. In other embodiments, second gate dielectric 20 can be deposited, e.g., by atomic layer deposition.

In the course of forming second gate dielectric 20, the thickness of first gate dielectric 16 may change, depending on the technique used to form the second gate dielectric 20, and should be taken into account in choosing the initial deposited or grown thickness of first gate dielectric 16. Generally, however, it is not anticipated that the thickness of first gate dielectric 16 will change significantly unless second gate dielectric 20 is deposited over first gate dielectric 16 rather than forming it through a thermal or chemical reaction of the substrate surface.

Now that gate dielectrics of two different thicknesses have been formed, a high-k dielectric (generally with k>4, preferably with k>6, and most preferably with k>7) is deposited over semiconductor device 10. In a preferred embodiment, this high-k dielectric is a metal oxide, such as metal oxide 26 shown in FIG. 3. Suitable materials for metal oxide 26 preferably include hafnium oxide ($HfO_2$), hafnium silicate ($Hf_xSi_yO_z$), or lanthanum aluminate ($LaAlO_3$), but lanthanum oxide, hafnium aluminate, zirconium oxide, and zirconium silicate, and other like materials, may also be suitable high-k dielectrics. The thickness of the high-k dielectric layer will be dependent on the particular device requirements in each region of the substrate (the core region and the I/O region), but generally it is believed the thickness of a metal oxide will be between about 15–50 angstroms (1.5–5.0 nanometers). The underlying thicknesses of first gate dielectric 16 and second gate dielectric 20 will also affect the choice of thickness of the high-k dielectric. The thickness of the high-k dielectric should be chosen so that its equivalent oxide thickness (EOT), when added to the EOT of the first gate dielectric 16 (I/O device dielectric) thickness or second gate dielectric 20 (core device dielectric) thickness, provides a total EOT appropriate for the I/O and core device, respectively. Similarly, this calculation should be used to determine the initial deposited or grown thicknesses of the first and second gate dielectrics. Because metal oxide 26 is deposited as a single blanket deposition, its thickness will not vary much across the substrate surface and thus one should use the thicknesses of the first and second dielectrics as the "variables" to achieve the final EOTs for the core and I/O devices.

As is apparent from FIG. 3, a single metal oxide layer can be used while still achieving two different EOTs for different devices on the same substrate. If one were to incorporate a metal oxide into a conventional dual gate oxide (DGO) process, two different metal oxide thicknesses would be required to satisfy both core device and I/O device requirements. Problems associated with forming two different metal oxide thickness on the same substrate include: 1) difficulty in uniformly and selectively etching a metal oxide over a silicon substrate, and 2) difficulty in forming high quality interfaces between the metal oxide and silicon substrate and between the metal oxides deposited on top of one another in the I/O device region. With the present invention, a single metal oxide deposition is used, and the metal oxide is formed over prepared surfaces of the substrate which already provide a difference in EOT between the core device region 22 and I/O device region 24. The metal oxide need not be etched selective to the underlying silicon substrate where a gate quality surface is required. Also with the invention, the metal oxide forms an interface with a high quality silicon dioxide or silicon oxynitride layer, as opposed to a silicon surface which has been damaged or otherwise treated as a result of conventional DGO processing with a metal oxide. Another benefit of the invention is that there is no metal oxide deposition on a metal oxide layer which has been damaged or treated as a result of conventional DGO processing.

After metal oxide layer 26 has been deposited, a gate electrode material 28 is deposited over the metal oxide, and semiconductor device 10 is patterned and etched to form the gate stacks as shown in FIG. 4. Gate electrode material 28 will generally be conductive (doped) polysilicon or a metal (e.g. titanium nitride). Preferably the same etch mask is used to pattern gate stacks in both the I/O and core device regions, but etch requirements may make it more desirable to use two masks, one for each of the two regions. At this point, conventional processing occurs to complete the transistor and integrated circuit formation (e.g. implants, spacers, interlayer dielectrics, interconnects, and passivation formation).

In accordance with another embodiment of the invention, similar processing can be used to form a triple gate oxide (TGO) device. In certain applications, in addition to core and I/O devices, there is a need for even higher voltage devices and thus the need for three different gate dielectric thicknesses. As shown in FIG. 5, a semiconductor device 50 includes gate dielectrics 52, 54, and 56 with respectively increasing physical thicknesses. Gate dielectric 52 could serve as the gate dielectric for a core logic device. Gate dielectric 54 could serve as the gate dielectric for an I/O device. While, gate dielectric 56 could serve as the gate dielectric for a high voltage device. These gate dielectrics would be formed in a manner similar to the way gate dielectrics 16 and 20 were described in reference to FIGS. 1–2. The difference would be that the first dielectric layer formed would be the thickest dielectric needed (e.g. for the highest voltage devices), and that prior to forming the thinnest dielectric needed for the core devices, the intermediate thickness gate dielectric (e.g. for the I/O devices) would be formed. This could be accomplished by: 1) masking the thickest dielectric in a region where the high voltage devices would be formed; 2) etching this (thickest) dielectric in the core device and I/O device regions; 3) forming the gate dielectric for the I/O devices in both the core device region and the I/O device region; 4) masking the I/O gate dielectric and the thickest dielectric in the I/O and high voltage device regions; 5) etching the I/O dielectric in the core device region; and 6) forming the gate dielectric of the core devices. After forming the three different EOTs, a single high-k dielectric such as a metal oxide would be deposited over the substrate and processing would continue as previously described in reference to FIGS. 3–4.

Figure 6:
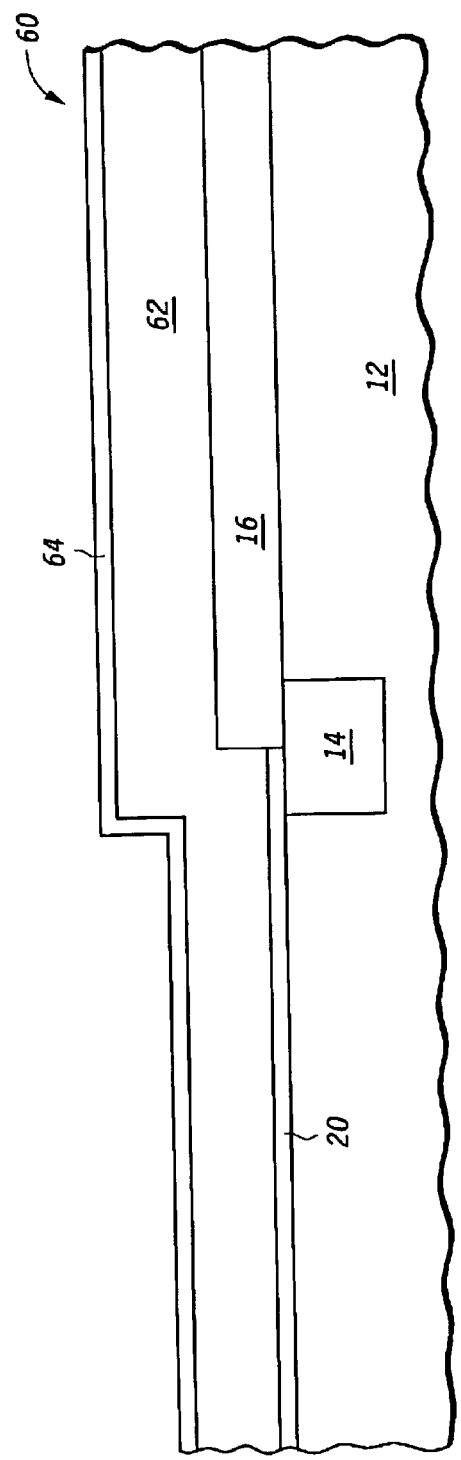
FIG. 6 is a partial cross-sectional view of a semiconductor device formed in accordance with yet another embodiment of the present invention in which a stack of metal oxide layers, rather than a single metal oxide layer, is used as part of the gate dielectric for each type of device to be formed (e.g. for both core devices and I/O devices).

In yet another embodiment, a process in accordance with the invention includes a metal oxide stack as opposed to a single metal oxide layer. As shown in FIG. 6, a semiconductor device 60 is fabricated having two different EOTs as previously described in reference to FIGS. 1–2. Thereafter, a first metal oxide layer 62 is blanket deposited over the substrate, followed by a blanket deposition of a second metal oxide layer 64. In a preferred embodiment, the two metal oxide layers are of different materials. One advantage in using two different metal oxides is that the grain boundaries within the layers can be misaligned to reduce current leakage in the transistor. Another reason for using two different materials is that one material may have desirable properties as a gate dielectric but may not be compatible with the material used to form the overlying gate electrode. Thus, the second metal oxide can be chosen to be compatible with the gate electrode. In one embodiment, first metal oxide layer is zirconium oxide ($ZrO_2$) or hafnium oxide ($HfO_2$) and the second metal oxide is alumina ($Al_2O_3$). When using a polysilicon gate electrode material, the alumina may alleviate some of the compatability concerns between polysilicon and hafnium oxide or zirconium oxide. Generally, the second or top metal oxide layer will be thinner than the first metal oxide layer because it is being used principally as a capping layer rather than the bulk gate dielectric of the transistor. Metal gate electrodes may also benefit from use of a capping layer over the bulk dielectric material.

In the foregoing specification, the invention has been described with reference to specific embodiments. However, one of ordinary skill in the art appreciates that various modifications and changes can be made without departing from the scope of the present invention as set forth in the claims below. For example, while the invention has been described as forming core logic devices and I/O devices to have differing gate dielectric thicknesses, the invention can be used in conjunction with any two devices that have or require different gate dielectric thicknesses. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:

providing a semiconductor substrate;

forming a first gate dielectric layer overlying the semiconductor substrate, the first sate dielectric layer having a first thickness in a range of 30–50 Angstroms;

removing a portion of the first gate dielectric layer overlying a first region of the semiconductor substrate;

forming a second gate dielectric layer overlying the first region of the semiconductor substrate, the second gate dielectric layer having a second thickness less than the first thickness; and forming a metal oxide layer overlying the first gate dielectric layer and the second gate dielectric layer.

2. The method of claim 1, wherein the first gate dielectric layer comprises a material selected from a group consisting of silicon oxide and silicon oxynitride.

3. The method of claim 1, wherein the second gate dielectric layer comprises a material selected from a group consisting of silicon oxide and silicon oxynitride.

4. The method of claim 1, wherein the metal oxide layer comprises a material selected from a group consisting of hafnium dioxide, hafnium silicate, and lanthanum aluminate.

5. The method of claim 1, wherein forming the second game dielectric layer comprises a process selected from a group consisting of thermal oxidation, chemical oxidation, or deposition.

6. The method of claim 5, wherein forming the second gate dielectric layer is formed by oxidation of the semiconductor substrate.

7. The method of claim 1, further comprising:

forming a gate layer overlying the metal oxide layer and patterning the gate layer, metal oxide layer, first gate dielectric layer, and second gate dielectric layer to form a first gate electrode stack and a second gate electrode stack.

8. The method of claim 7 wherein the first gate electrode stack is used in a core logic device and the second gate electrode stack is used in an I/O device.

9. The method of claim 1, further comprising:

removing portions of the second gate dielectric layer overlying a second region of the semiconductor substrate; and forming a third gate dielectric layer overlying the second region of the semiconductor substrate;

wherein forming the metal oxide layer comprises forming the metal oxide layer overlying the first gale dielectric layer, the second gate dielectric layer, and the third gate dielectric layer.

10. The method of claim 9, wherein the first, second, and third dielectric layers each have different thicknesses.

11. The method of claim 1, wherein the first and second dielectric layers have different thicknesses.

12. The method of claim 1, further comprising forming a second metal oxide layer overlying the metal oxide layer.

13. The method of claim 1 wherein the metal oxide layer comprises a material having a dielectric constant greater than about 6.

14. A method for forming a semiconductor device comprising:

providing a semiconductor substrate;

forming a first dielectric material overlying the semiconductor substrate wherein a first portion of the first dielectric material overlying a first region of the semiconductor substrate has a first thickness and a second portion of the first dielectric material overlying a second region of the semiconductor substrate has a second thickness different from the first thickness, and wherein the first thickness is in a range of 30 to 50 Angstroms;

forming a high-k dielectric layer overlying the first dielectric material;

forming a gate layer overlying the high-k dielectric layer, and patterning the gate layer and the high-k dielectric layer to form a gate of a first device within the first region of the semiconductor substrate and a gate of a second device within the second region of the semiconductor substrate.

15. The method of claim 14, wherein the first dielectric material comprises a material selected from a group consisting of silicon dioxide and silicon oxynitride.

16. The method of claim 14, wherein the high-k dielectric layer comprises a metal oxide.

17. The method of claim 16, wherein the metal oxide comprises a material selected from a group consisting of hafnium dioxide, hafnium silicate, and lanthanum, aluminate.

18. The method of claim 14, wherein a third portion of the first dielectric material overlying a third region of the semiconductor substrate has a third thickness different from the first and second thicknesses, and wherein patterning further comprises forming a third device within the third region of the semiconductor substrate.

19. The method of claim 1 wherein the metal oxide layer comprises a material having a dielectric constant greater than about 6.

* * * * *